United States Patent
Pillarisetty et al.

(10) Patent No.: US 8,710,490 B2
(45) Date of Patent: Apr. 29, 2014

(54) SEMICONDUCTOR DEVICE HAVING GERMANIUM ACTIVE LAYER WITH UNDERLYING PARASITIC LEAKAGE BARRIER LAYER

(71) Applicants: Ravi Pillarisetty, Portland, OR (US); Niti Goel, Portland, OR (US); Han Wui Then, Portland, OR (US); Van H. Le, Beaverton, OR (US); Willy Rachmady, Beaverton, OR (US); Marko Radosavljevic, Beaverton, OR (US); Gilbert Dewey, Hillsboro, OR (US); Benjamin Chu-Kung, Hillsboro, OR (US)

(72) Inventors: Ravi Pillarisetty, Portland, OR (US); Niti Goel, Portland, OR (US); Han Wui Then, Portland, OR (US); Van H. Le, Beaverton, OR (US); Willy Rachmady, Beaverton, OR (US); Marko Radosavljevic, Beaverton, OR (US); Gilbert Dewey, Hillsboro, OR (US); Benjamin Chu-Kung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/629,178

(22) Filed: Sep. 27, 2012

(65) Prior Publication Data

US 2014/0084246 A1    Mar. 27, 2014

(51) Int. Cl.
  *H01L 29/06*    (2006.01)
  *H01L 21/02*    (2006.01)

(52) U.S. Cl.
  USPC 257/24; 257/616; 257/E29.251; 257/E29.295

(58) Field of Classification Search
  CPC  B82Y 10/00; H01L 29/0665; H01L 29/1054; H01L 29/0673; H01L 29/165
  USPC ............ 257/24, 616, E29.251, E29.297
  See application file for complete search history.

(56) References Cited

U.S. PATENT DOCUMENTS

| | | | |
|---|---|---|---|
| 2006/0214156 A1* | 9/2006 | Pan et al. | 257/40 |
| 2007/0187716 A1* | 8/2007 | Chu | 257/192 |
| 2009/0189189 A1 | 7/2009 | Kamata | |
| 2011/0127618 A1 | 6/2011 | Scheiper et al. | |
| 2012/0193708 A1 | 8/2012 | Flachowsky et al. | |

FOREIGN PATENT DOCUMENTS

| | | |
|---|---|---|
| KR | 10-2006-0023489 | 3/2006 |
| KR | 10-2011-0078162 | 7/2011 |

OTHER PUBLICATIONS

International Search Report and Written Opinion from PCT/US2013/047430 mailed Sep. 25, 2013, 9 pgs.

* cited by examiner

*Primary Examiner* — Nikolay Yushin
(74) *Attorney, Agent, or Firm* — Blakely, Sokoloff, Taylor & Zafman LLP

(57) ABSTRACT

Semiconductor devices having germanium active layers with underlying parasitic leakage barrier layers are described. For example, a semiconductor device includes a first buffer layer disposed above a substrate. A parasitic leakage barrier is disposed above the first buffer layer. A second buffer layer is disposed above the parasitic leakage barrier. A germanium active layer is disposed above the second buffer layer. A gate electrode stack is disposed above the germanium active layer. Source and drain regions are disposed above the parasitic leakage barrier, on either side of the gate electrode stack.

34 Claims, 7 Drawing Sheets

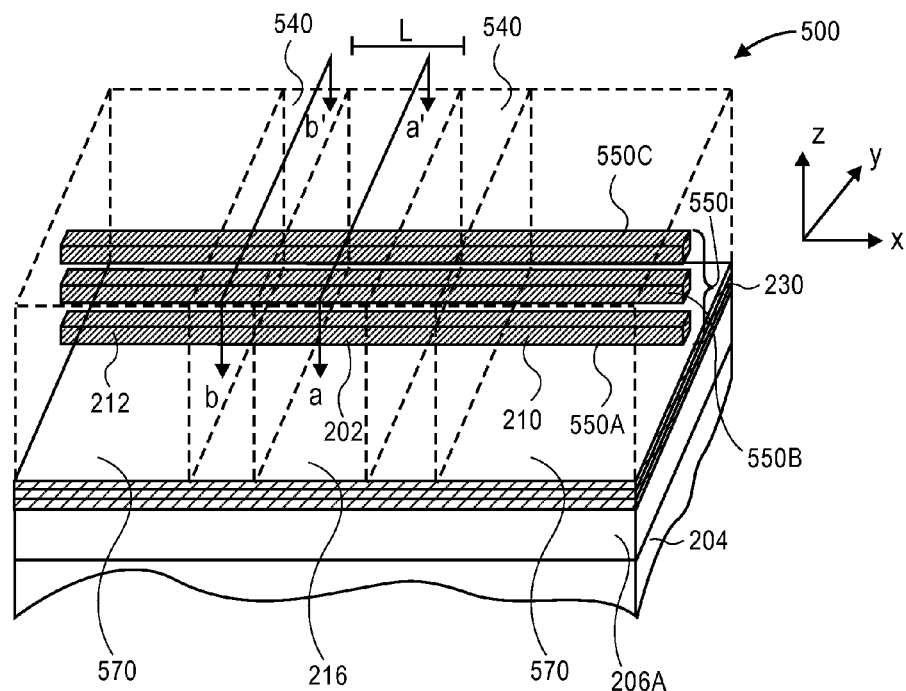
FIG. 5A
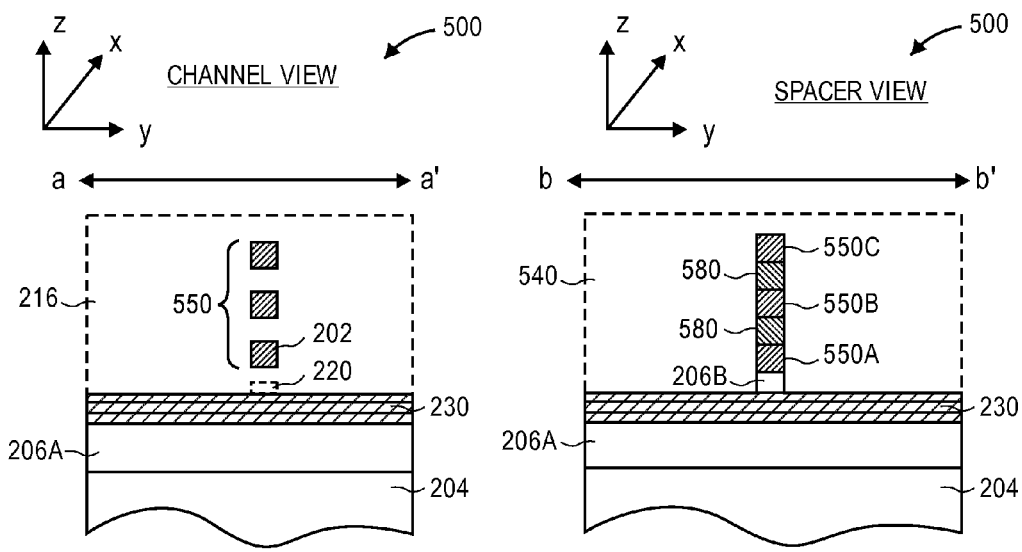
FIG. 5B  FIG. 5C

SEMICONDUCTOR DEVICE HAVING GERMANIUM ACTIVE LAYER WITH UNDERLYING PARASITIC LEAKAGE BARRIER LAYER

TECHNICAL FIELD

Embodiments of the invention are in the field of semiconductor devices and, in particular, semiconductor devices having germanium active layers with underlying parasitic leakage barrier layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the reduced leakage they can offer.

On bulk silicon substrates, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate capacitance parasitics.

Many different techniques have been attempted to reduce junction leakage of transistors. However, significant improvements are still needed in the area of junction leakage suppression.

BRIEF DESCRIPTION OF THE DRAWINGS

FIG. 5A illustrates a three-dimensional cross-sectional view of a nanowire-based semiconductor structure, in accordance with an embodiment of the present invention.

FIG. 5B illustrates a cross-sectional channel view of the nanowire-based semiconductor structure of FIG. 5A, as taken along the a-a' axis, in accordance with an embodiment of the present invention.

FIG. 5C illustrates a cross-sectional spacer view of the nanowire-based semiconductor structure of FIG. 5A, as taken along the b-b' axis, in accordance with an embodiment of the present invention.

DESCRIPTION OF THE EMBODIMENTS

Semiconductor devices having germanium active layers with underlying parasitic leakage barrier layers are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described below are directed to approaches, and the resulting structures, to reducing parasitic leakage in germanium active layer devices. For example, one or more embodiments may be particularly effective for improving performance in germanium-based nanowire or gate-all-around devices.

Figure 1:
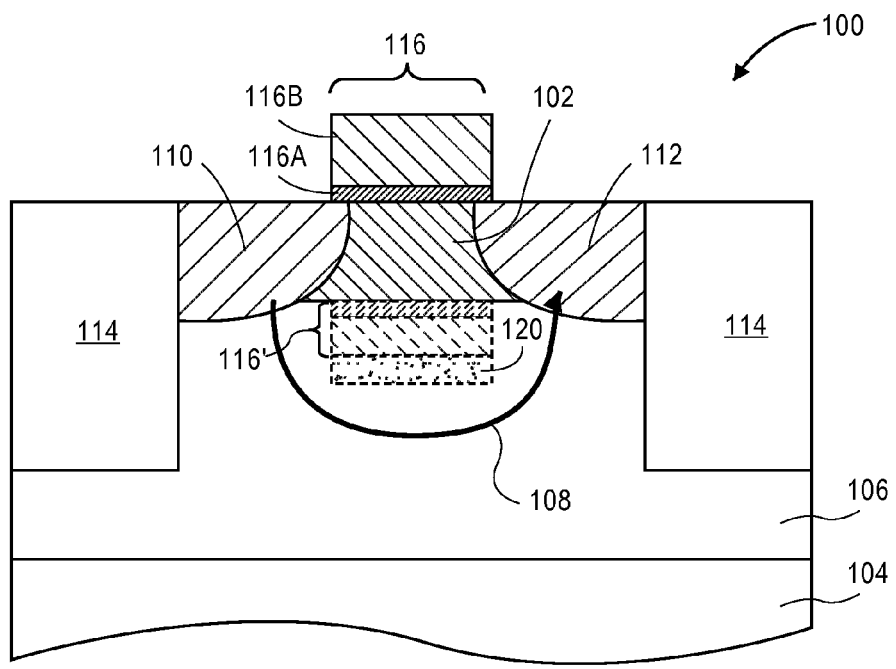
FIG. 1 illustrates a cross-sectional view of a conventional semiconductor device.

To exemplify the concepts described herein, FIG. 1 illustrates a cross-sectional view of a conventional semiconductor device. Referring to FIG. 1, a conventional device 100 includes a germanium (Ge) channel region 102 grown above a silicon (Si) substrate 104 (e.g., as a portion of a silicon wafer) via relaxed silicon germanium (SiGe) buffer layers 106 (e.g., 70% SiGe buffer, which grades to 50% SiGe and ultimately to the essentially pure Ge channel region 102) to manage lattice mismatch between Ge and Si. These SiGe buffer layers 106 are, however, fairly conductive in that they allow parallel conduction within the region underlying the channel region 102, at least within the SiGe buffer layers 106. The parallel conduction may cause parasitic leakage in the device 100, as depicted by arrow 108, from the source region 110 to the drain region 112. It is noted that FIG. 1 also depicts isolation regions 114 and a gate electrode stack 116, such as a titanium nitride (TiN) gate 116B and high-k gate dielectric 116A electrode stack 116. It is to be understood that such leakage may occur even in the case of a wrap-around or nanowire arrangement, where a bottom gate electrode stack 116' disposed on a bottom gate insulator (BGI) structure 120 is included.

In addition to, or in conjunction with, parasitic leakage 108, poor interfaces formed between the isolation regions 114 and the germanium-based buffer layers may generate significant surface states causing or contributing to the parasitic leakage. Regardless of how generated, parasitic leakage 108 can hamper transistor performance since it may degrade the off state leakage of the device. Ultimately, such parasitic leakage can render fabricating a low leakage germanium-based semiconductor device difficult to achieve.

In order to address the above described issues, in an embodiment, a parasitic leakage barrier layer is integrated with a germanium-based semiconductor device. As an example, FIG. 2 illustrates a cross-sectional view of a semiconductor device having a germanium active layer and an underlying parasitic leakage barrier layer, in accordance with an embodiment of the present invention.

Figure 2:
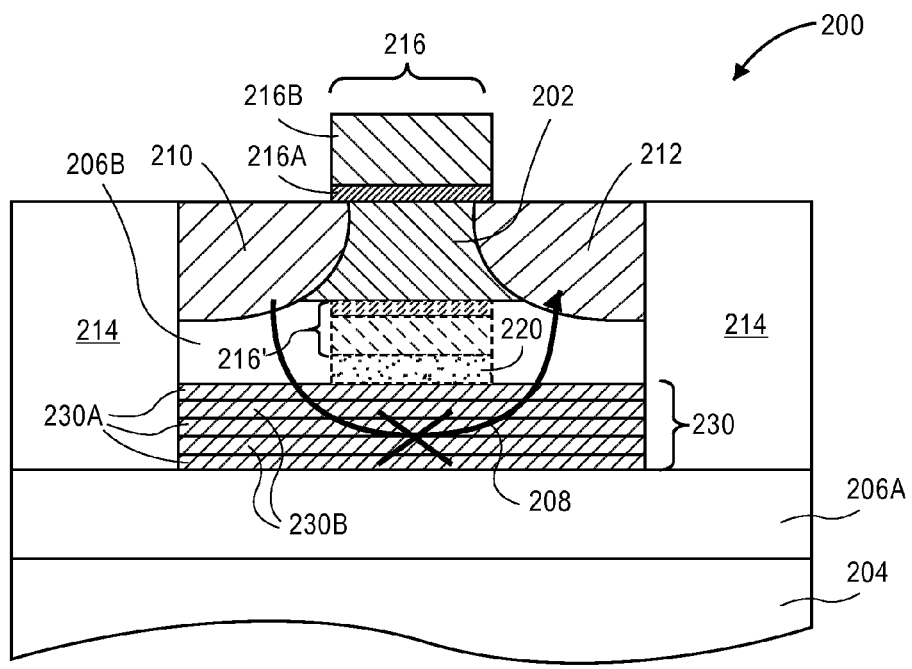
FIG. 2 illustrates a cross-sectional view of a semiconductor device having a germanium active layer and an underlying parasitic leakage barrier layer, in accordance with an embodiment of the present invention.

Referring to FIG. 2, a semiconductor device 200 includes a germanium (Ge) channel region 202 grown on a silicon (Si) substrate 204 (e.g., as a portion of a silicon wafer) via silicon germanium (SiGe) buffer layers 206A and 206B (e.g., 70% SiGe buffer 206A, which grades to 50% SiGe 206B and ultimately to the essentially pure Ge channel region 202) to manage lattice mismatch between Ge and Si. A parasitic leakage barrier 230 is disposed between the buffer layers 206A and 206B. Semiconductor device 200 may also include isolation regions 214 and a gate electrode stack 216, such as a titanium nitride (TiN) gate 216B and high-k gate dielectric 216A electrode stack 216. A wrap-around or nanowire arrangement may be formed, where a bottom gate electrode stack 216' disposed on a bottom gate insulator (BGI) structure 220 is included. Source and drain regions 210 and 212, respectively, are included on either side of gate electrode stack 216, as is also depicted in FIG. 2. In an embodiment, the parasitic leakage barrier 230 blocks a leakage path 208 from source region 210 to drain region 212, which was not blocked in device 100 of FIG. 1.

As used throughout, the terms pure or essentially pure germanium may be used to describe a germanium material composed of a very substantial amount of, if not all, germanium. However, it is to be understood that, practically, 100% pure Ge may be difficult to form and, hence, could include a tiny percentage of Si. The Si may be included as an unavoidable impurity or component during deposition of Ge or may "contaminate" the Ge upon diffusion during post deposition processing. As such, embodiments described herein directed to a Ge channel may include Ge channels that contain a relatively small amount, e.g., "impurity" level, non-Ge atoms or species, such as Si.

In an embodiment, the parasitic leakage barrier 230 includes a semiconductor layer having a band-gap greater than a band-gap of the first buffer layer 206A, greater than a band-gap of the second buffer layer 206B, and greater than a band-gap of the germanium active layer 202. In that way, low leakage pathways are blocked by the higher band-gap semiconductor layer. In an embodiment, however, the parasitic leakage barrier 230 does not disrupt an effective lattice constant of the first buffer layer 206A. In that way, e.g., the grading from a silicon substrate to a germanium active region is maintained without interrupting or causing defects in the transition from substrate 204 to active region 202. Thus, in one embodiment, a higher band-gap material such as silicon is formed to a thickness sufficiently thin to not alter the lattice constant of the buffer layer 206.

In an exemplary embodiment, the substrate 204 is composed essentially of silicon, the first buffer layer 206A is composed of silicon germanium, the second buffer layer 206B is composed of silicon germanium having a higher concentration of germanium than the first buffer layer (e.g., 50% Ge versus 30% Ge), and the germanium active layer 202 is composed essentially of germanium. In one such embodiment, the parasitic leakage barrier 230 includes a layer composed essentially of silicon or of silicon germanium having a lower concentration of germanium than the first or second buffer layers (e.g., approximately 10% Ge). In another such embodiment, the parasitic leakage barrier 230 includes alternating first and second layer types 230A and 230B, an example layering structure of which is depicted in FIG. 2. The first layer types are composed essentially of silicon or of silicon germanium having a lower concentration of germanium than the first or second buffer layers. The second layer types are composed essentially of the same material as the first buffer layer 206A. In a specific such embodiment, the first buffer layer 206A is composed approximately of $Si_{0.7}Ge_{0.3}$, the second buffer layer is composed approximately of $Si_{0.3}Ge_{0.7}$, and the first layer types 203A are composed essentially of silicon and have a thickness approximately in the range of 1-3 nanometers. The number of each layer may vary as may the identity of the first and last layers (i.e., first or second layer type). In an exemplary embodiment, approximately 3-5 alternating pairs 230A and 230B make up the parasitic leakage barrier 230. In an alternative embodiment, the second layer types are composed essentially of the same material as the second buffer layer.

In an embodiment, the source and drain regions 210/212 are disposed in the germanium active layer 202 and in the second buffer layer 206B, but are not in contact with the parasitic leakage barrier 230, as depicted in FIG. 2. FIG. 2 is shown generically to represent a variety of options. In a first embodiment, the source and drain regions are formed by doping portions of the germanium active layer 202 and in the second buffer layer 206B, as described in greater detail in association with FIG. 3. In a second embodiment, portions of the germanium active layer 202 and in the second buffer layer 206B and a different semiconductor material is grown to form the source and drain regions 210/212.

Substrate 204 may be composed of a semiconductor material that can withstand a manufacturing process and in which charge can migrate. In an embodiment, the substrate 204 is a bulk substrate, such as a P-type silicon substrate as is commonly used in the semiconductor industry. In an embodiment, substrate 204 is composed of a crystalline silicon, silicon/germanium or germanium layer doped with a charge carrier, such as but not limited to phosphorus, arsenic, boron or a combination thereof. In one embodiment, the concentration of silicon atoms in substrate 204 is greater than 97% or, alternatively, the concentration of dopant atoms is less than 1%. In another embodiment, substrate 204 is composed of an epitaxial layer grown atop a distinct crystalline substrate, e.g. a silicon epitaxial layer grown atop a boron-doped bulk silicon mono-crystalline substrate.

Substrate 204 may instead include an insulating layer disposed in between a bulk crystal substrate and an epitaxial layer to form, for example, a silicon-on-insulator substrate. In an embodiment, the insulating layer is composed of a material such as, but not limited to, silicon dioxide, silicon nitride, silicon oxy-nitride or a high-k dielectric layer. Substrate 204 may alternatively be composed of a group III-V material. In an embodiment, substrate 204 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In another embodiment, substrate 204 is composed of a III-V material and charge-carrier dopant impurity atoms such as, but not limited to, carbon, silicon, germanium, oxygen, sulfur, selenium or tellurium.

In an embodiment, the gate electrode of gate electrode stack 216 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the germanium active layer 202. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In an embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In an embodiment, the gate electrode is composed of a P-type or N-type material. The gate electrode stack 216 may also include dielectric spacers, not depicted.

The semiconductor device 200 is shown generically to cover both planar and non-planar devices, including gate-all-around devices. Such devices are described more specifically below with FIG. 3 (planar device), FIG. 4 (non-planar device) and FIG. 5 (nanowire-based device). In all cases, a parasitic leakage barrier is integrated with the device. The parasitic leakage barrier may be effective for suppressing the leakage in such devices. Thus, semiconductor device 200 may be a semiconductor device incorporating a gate, a channel region and a pair of source/drain regions. In an embodiment, semiconductor device 200 is one such as, but not limited to, a MOS-FET or a Microelectromechanical System (MEMS). In one embodiment, semiconductor device 200 is a planar or three-dimensional MOS-FET and is an isolated device or is one device in a plurality of nested devices. As will be appreciated for a typical integrated circuit, both N- and P-channel transistors may be fabricated on a single substrate to form a CMOS integrated circuit. Furthermore, additional interconnect wiring may be fabricated in order to integrate such devices into an integrated circuit.

Figure 3:
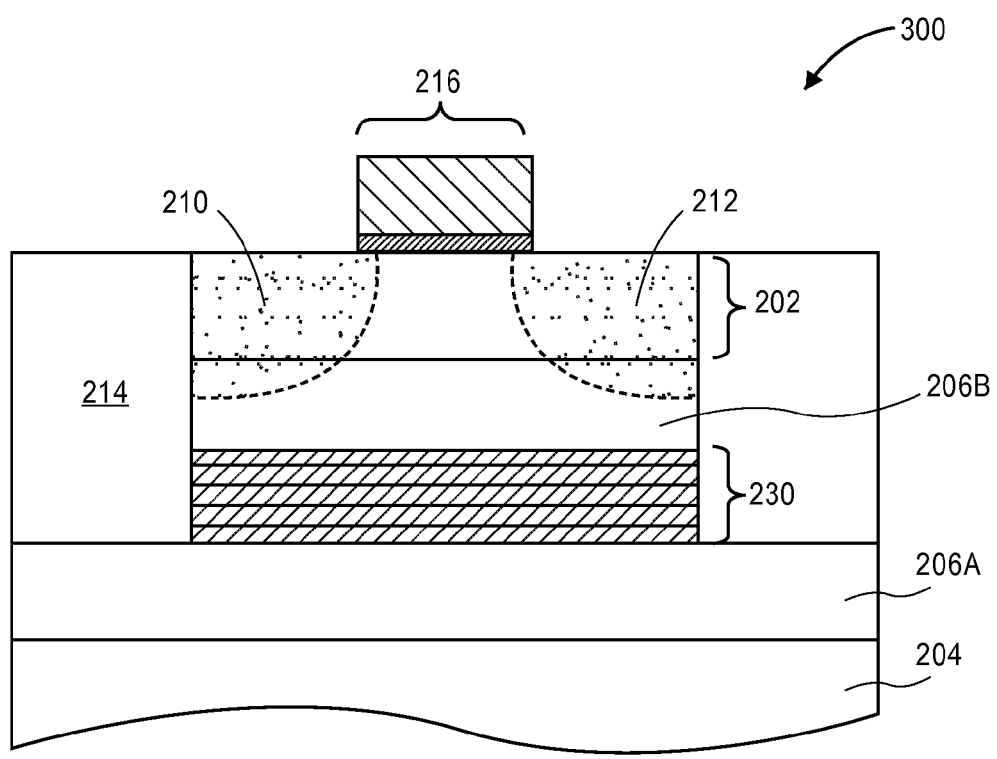
FIG. 3 illustrates a cross-sectional view of a planar semiconductor device having a germanium active layer and an underlying parasitic leakage barrier layer, in accordance with an embodiment of the present invention.

As an example, FIG. 3 illustrates a cross-sectional view of a planar semiconductor device having a germanium active layer and an underlying parasitic leakage barrier layer, in accordance with an embodiment of the present invention. In one such embodiment, the semiconductor device is a planar device having a gate electrode stack disposed on only a single surface of a germanium active layer.

Referring to FIG. 3, a planar semiconductor device 300 includes a first buffer layer 206A disposed above a substrate 204. A parasitic leakage barrier 230 is disposed above the first buffer layer 206A. A second buffer layer 206B is disposed above the parasitic leakage barrier 230. A germanium active layer 202 is disposed above the second buffer layer 206B. A gate electrode stack 216 is disposed above the germanium active layer 202. Source and drain regions 210/212 are disposed above the parasitic leakage barrier 230, on either side of the gate electrode stack 216. More specifically, in an embodiment, the source and drain regions 210/212 are formed by doping portions of the germanium active layer 202 and in the second buffer layer 206B, as depicted in FIG. 3. In an embodiment, the first buffer layer 206A is disposed on the substrate 204, the parasitic leakage barrier 230 is disposed on the first buffer layer 206A, the second buffer layer 206B is disposed on the parasitic leakage barrier 230, the germanium active layer 202 is disposed on the second buffer layer 206B, and the gate electrode stack 216 is disposed on the germanium active layer 202, as is also depicted in FIG. 3.

As depicted in FIG. 3, semiconductor device 300 may also include isolation regions 214. Although depicted as being somewhat aligned with the bottom of the parasitic leakage barrier 230, it is to be understood that the depth of the isolation regions 214 may vary. It is also to be understood that like feature designations of FIG. 3 may be as described in association with FIG. 2.

Figure 4:
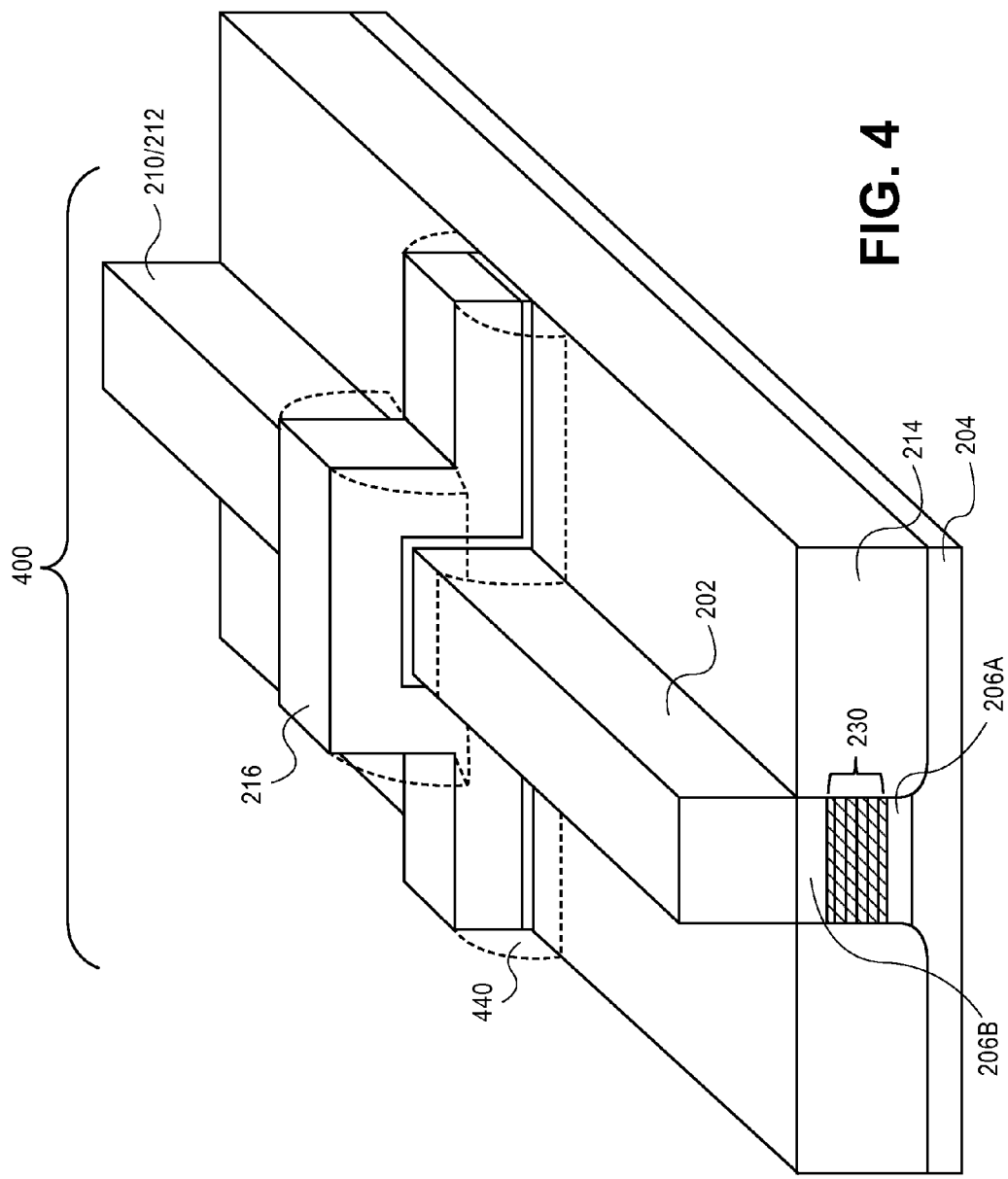
FIG. 4 illustrates an angled view of a non-planar semiconductor device having a germanium active layer and an underlying parasitic leakage barrier layer, in accordance with an embodiment of the present invention.

As mentioned above, embodiments of the present invention may be applied to non-planar MOS-FETs. For example, devices with a three-dimensional architecture, such as tri-gate devices, may benefit from the above described process. FIG. 4 illustrates an angled view of a non-planar semiconductor device having a germanium active layer and an underlying parasitic leakage barrier layer, in accordance with an embodiment of the present invention.

Referring to FIG. 4, a non-planar semiconductor device 400 includes a first buffer layer 206A disposed above a substrate 204. A parasitic leakage barrier 230 is disposed above the first buffer layer 206A. A second buffer layer 206B is disposed above the parasitic leakage barrier 230. A three-dimensional germanium active layer 202 is disposed above the second buffer layer 206B. A gate electrode stack 216 is disposed on and at least partially surrounds the three-dimensional germanium active layer 202. Source and drain regions 210/212 are disposed above the parasitic leakage barrier 230, on either side of the gate electrode stack 216. Also depicted are isolation regions 214 and gate electrode spacers 440.

Although not depicted in the view shown in FIG. 4, but is shown as an option in FIG. 2, in one embodiment, the gate electrode stack 216 completely surrounds the three-dimensional germanium active layer 202. In that embodiment, and the non-planar semiconductor device 400 further includes a bottom gate insulating (BGI) structure (220 in FIG. 2) disposed between the parasitic leakage barrier 230 and a bottom portion of the gate electrode stack (216' in FIG. 2). In another embodiment, however, the gate electrode 216 only surrounds the three-dimensional germanium active layer 202 on the exposed top and sides of the three-dimensional germanium active layer 202.

Although depicted in FIG. 4 as being somewhat aligned with the bottom of the first buffer layer 206A, it is to be understood that the depth of the isolation regions 214 may vary. Also, although depicted in FIG. 4 as being somewhat aligned with the top of the second buffer layer 206B, it is to be understood that the height of the isolation regions 214 may vary. It is also to be understood that like feature designations of FIG. 4 may be as described in association with FIG. 2.

In another aspect, FIG. 5A illustrates a three-dimensional cross-sectional view of a germanium nanowire-based semiconductor structure, in accordance with an embodiment of the present invention. FIG. 5B illustrates a cross-sectional channel view of the germanium nanowire-based semiconductor structure of FIG. 5A, as taken along the a-a' axis. FIG. 5C illustrates a cross-sectional spacer view of the germanium nanowire-based semiconductor structure of FIG. 5A, as taken along the b-b' axis.

Referring to FIG. 5A, a semiconductor device 500 includes one or more vertically stacked germanium nanowires (550 set) disposed above a substrate 204. Embodiments herein are targeted at both single wire devices and multiple wire devices. As an example, a three nanowire-based devices having nanowires 550A, 550B and 550C is shown for illustrative purposes. For convenience of description, nanowire 550A is used as an example where description is focused on only one of the nanowires. It is to be understood that where attributes of one nanowire are described, embodiments based on a plurality of nanowires may have the same attributes for each of the nanowires.

At least the first nanowire 550A includes a germanium channel region 202. The germanium channel region 202 has a length (L). Referring to FIG. 5B, the germanium channel region 202 also has a perimeter orthogonal to the length (L). Referring to both FIGS. 5A and 5B, a gate electrode stack 216 surrounds the entire perimeter of each of the channel regions of each nanowire 550, including germanium channel region 202. The gate electrode stack 216 includes a gate electrode along with a gate dielectric layer disposed between the channel regions and the gate electrode (not individually shown). The germanium channel region 202 and the channel regions of the additional nanowires 550B and 550C are discrete in that they are completely surrounded by the gate electrode stack 216 without any intervening material such as underlying substrate material or overlying channel fabrication materials. Accordingly, in embodiments having a plurality of nanowires 5550, the channel regions of the nanowires are also discrete relative to one another, as depicted in FIG. 5B.

Referring to FIGS. 5A-5C, parasitic leakage barrier 230 is disposed above a first buffer layer 206A which is disposed above the substrate 204. The parasitic leakage barrier 230 is further disposed below the one or more nanowires 550. In an embodiment, the germanium channel region 202 is completely surrounded by gate electrode 216 and a bottom gate insulation (BGI) layer 220 is disposed between the parasitic leakage barrier 230 and a bottom portion of the gate electrode stack 216.

Referring again to FIG. 5A, each of the nanowires 550 also includes source and drain regions 210 and 212 disposed in the nanowire on either side of the channel regions, including on either side of germanium channel region 202. The source and drain regions 210/212 are disposed either on or above (with an intervening second buffer layer portion 206B, not depicted) the parasitic leakage barrier 230. In an embodiment, the source and drain regions 210/212 are embedded source and drain regions, e.g., at least a portion of the nanowires is removed and replaced with a source/drain material region. However, in another embodiment, the source and drain regions 210/212 are composed of portions of the one or more germanium nanowires 550.

A pair of contacts 570 is disposed over the source/drain regions 210/212. In an embodiment, the semiconductor device 500 further includes a pair of spacers 540. The spacers 540 are disposed between the gate electrode stack 216 and the pair of contacts 570. As described above, the channel regions and the source/drain regions are, in at least several embodiments, made to be discrete. However, not all regions of the nanowires 550 need be, or even can be made to be discrete. For example, referring to FIG. 5C, nanowires 550A-550C are not discrete at the location under spacers 540. In one embodiment, the stack of nanowires 550A-550C have intervening semiconductor material 580 there between, such as silicon germanium or silicon intervening between germanium nanowires. In one embodiment, the bottom nanowire 550A is still in contact with a portion of a second buffer layer 206B. Thus, in an embodiment, a portion of the plurality of vertically stacked nanowires 550 under one or both of the spacers 540 is non-discrete.

It is to be understood that like feature designations of FIG. 5A-5C may be as described in association with FIG. 2. Also, although the device 500 described above is for a single device, a CMOS architecture may also be formed to include both NMOS and PMOS nanowire-based devices disposed on or above the same substrate. In an embodiment, the nanowires 550 may be sized as wires or ribbons, and may have squared-off or rounded corners.

In another aspect, methods of fabricating a nanowire semiconductor structure are provided. For example, FIGS. 6A-6D illustrate three-dimensional cross-sectional views representing various operations in a method of fabricating a nanowire semiconductor device having a vertical arrangement of germanium nanowires and an underlying parasitic leakage barrier layer, in accordance with an embodiment of the present invention.

FIGS. 6A-6D illustrate three-dimensional cross-sectional views representing various operations in a method of fabricating a nanowire semiconductor device having a vertical arrangement of germanium nanowires and an underlying parasitic leakage barrier layer, in accordance with an embodiment of the present invention.

Figure 6A:
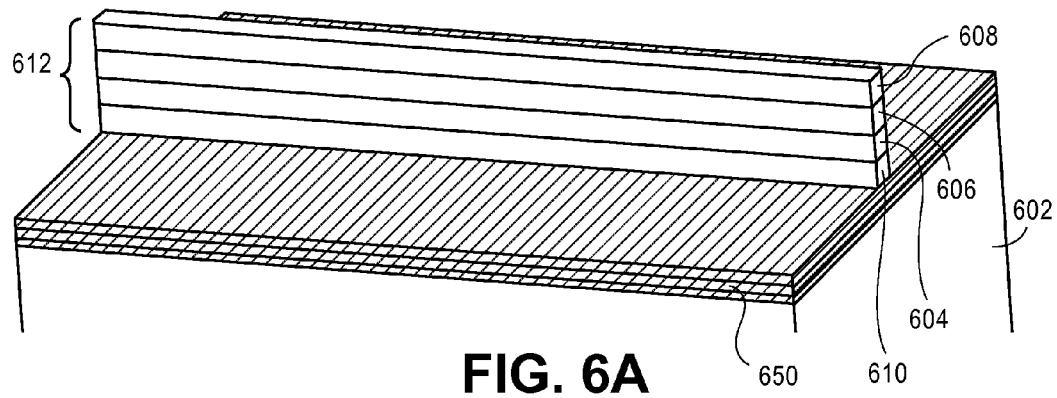
FIGS. 6A-6D illustrate three-dimensional cross-sectional views representing various operations in a method of fabricating a nanowire semiconductor device having a vertical arrangement of germanium nanowires and an underlying parasitic leakage barrier layer, in accordance with an embodiment of the present invention.

Referring to FIG. 6A, a fin 612 is formed above a substrate 602. The fin includes germanium wire-forming layers 604 and 608 and an intervening material layer 606, such as a silicon or silicon germanium layer. The fin also includes a patterned portion of a buffer layer 610, such as the second buffer layers described above. The fin is disposed on a parasitic leakage barrier layer 650. Although not depicted, in an embodiment, a grading stack is disposed directly between the substrate 602 and the parasitic leakage barrier layer 650.

Figure 6B:
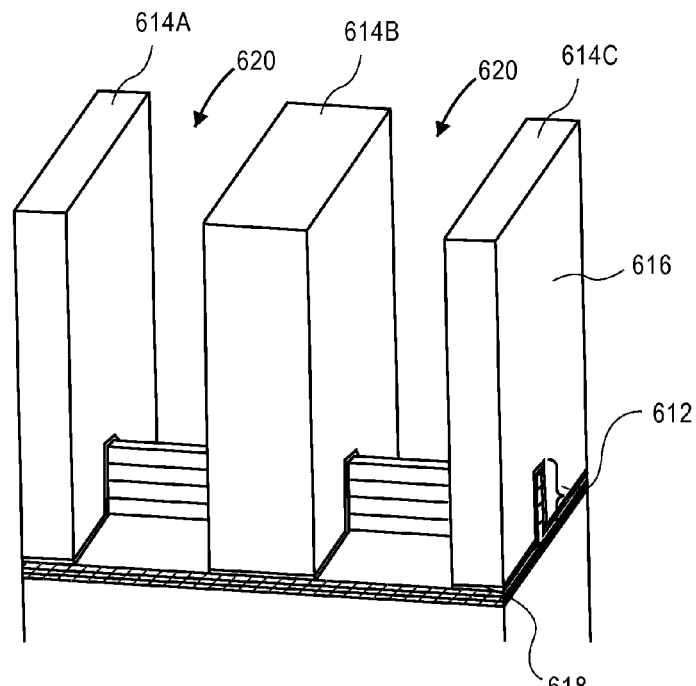

In a specific example showing the formation of three gate structures, FIG. 6B illustrates the fin-type structure 612 with three sacrificial gates 614A, 614B, and 614C disposed thereon. In one such embodiment, the three sacrificial gates 614A, 614B, and 614C are composed of a sacrificial gate oxide layer 616 and a sacrificial polysilicon gate layer 618 which are, e.g., blanket deposited and patterned with a plasma etch process.

Figure 6C:
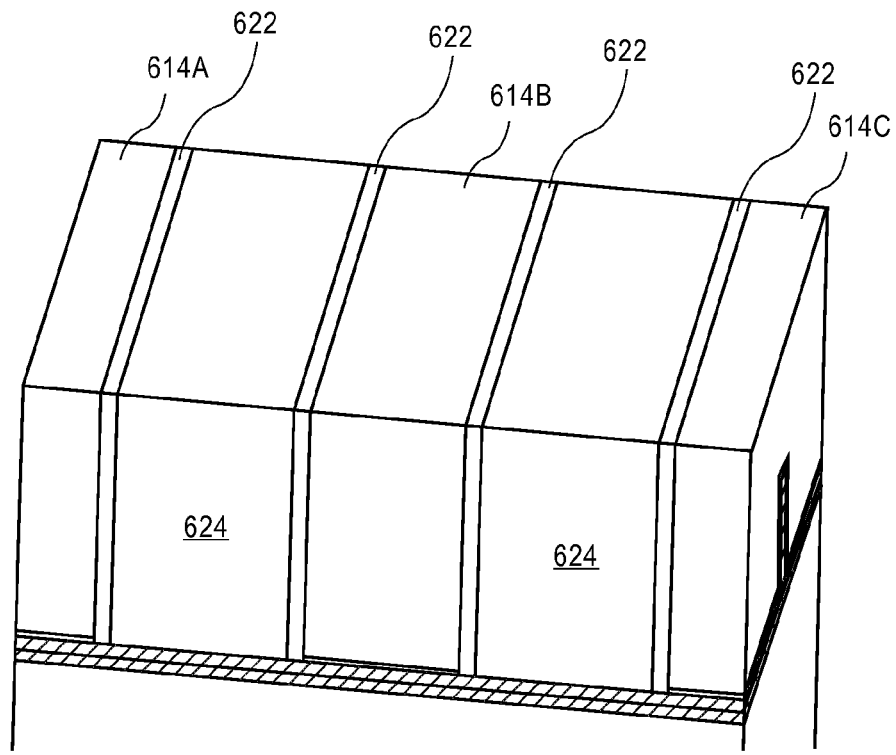

Following patterning to form the three sacrificial gates 614A, 614B, and 614C, spacers may be formed on the sidewalls of the three sacrificial gates 614A, 614B, and 614C, doping may be performed in regions 620 of the fin-type structure 612 shown in FIG. 6B (e.g., tip and/or source and drain type doping), and an interlayer dielectric layer may be formed to cover and then re-expose the three sacrificial gates 614A, 614B, and 614C. The interlayer dielectric layer may then be polished to expose the three sacrificial gates 614A, 614B, and 614C for a replacement gate, or gate-last, process. Referring to FIG. 6C, the three sacrificial gates 614A, 614B, and 614C are exposed, along with spacers 622 and interlayer dielectric layer 624.

Figure 6D:
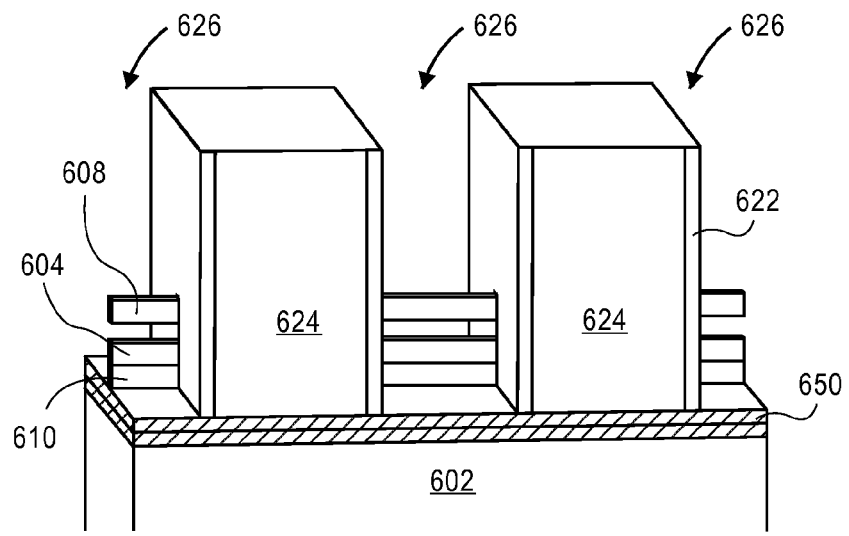

The sacrificial gates 614A, 614B, and 614C may then be removed, e.g., in a replacement gate or gate-last process flow, to expose channel portions of the fin-type structure 612. Referring to FIG. 6D, the sacrificial gates 614A, 614B, and 614C are removed to provide trenches 626 and, thus, reveal channel portions of the nanowires. Portions of the intervening layer 606 exposed by the trenches 626 are removed to leave discrete portions of the germanium layers 604 and 608.

In an embodiment, the intervening layer 606, which may be a silicon-containing layer, is etched selectively with a wet etch that selectively removes silicon while not etching the germanium nanowire structures 604 and 608. In an embodiment, although not shown, portions of the buffer layer 610 may also be removed, e.g., prior to, following, or at the same time as removal of intervening layer 606. Also, the parasitic leakage barrier layer 650 may be totally removed or only partially removed, e.g., leaving remnants under the spacers, or alternatively may be left in tact. In one embodiment, etch selectivity needed in the fabrication of Ge nanowire/nanoribbon devices is enhanced by using a lower germanium content in adjacent layers, e.g., through a galvanic coupling effect. Such etch chemistries as aqueous hydroxide chemistries, including ammonium hydroxide and potassium hydroxide, for example, may be utilized to selectively etch the layers 606 and/or 610. Subsequently device fabrication may be completed. In one embodiment, a surrounding gate electrode is formed around the germanium nanowires 604 and 608 and on the parasitic leakage barrier layer 650, as described above in association with FIG. 5A.

Thus, the discrete portions of the germanium layers 604 and 608 will, in one embodiment, ultimately become channel regions in a nanowire-based structure. Thus, at the process stage depicted in FIG. 6D, channel engineering or tuning may be performed. For example, in one embodiment, the discrete portions of the germanium layers 604 and 608 are thinned using oxidation and etch processes. Such an etch process may be performed at the same time the wires are separated or individualized. Accordingly, the initial wires formed from germanium layers 604 and 608 may begin thicker and are thinned to a size suitable for a channel region in a nanowire device, independent from the sizing of the source and drain regions of the device.

Following formation of the discrete channel regions as depicted in FIG. 6D, high-k gate dielectric and metal gate processing may be performed and source and drain contacts may be added be added. Contacts may be formed in the place of the interlayer dielectric layer 624 portions remaining in FIG. 6D.

Thus, one or more embodiments described herein are targeted at germanium active region arrangements substrate arrangements integrated with parasitic leakage barrier layers. Such arrangements may be included to form germanium based transistors such as planar devices, fin or tri-gate based devices, and gate all around devices, including nanowire-based devices. Embodiments described herein may be effective for junction isolation in metal-oxide-semiconductor field effect transistors (MOSFETs). It is to be understood that formation of materials such as first and second buffer layers 206A/B, the layers of a parasitic leakage barrier stack 230, and the germanium active region 202 may be formed by techniques such as, but not limited to, chemical vapor deposition (CVD) or molecular beam epitaxy (MBE), or other like processes.

Figure 7:
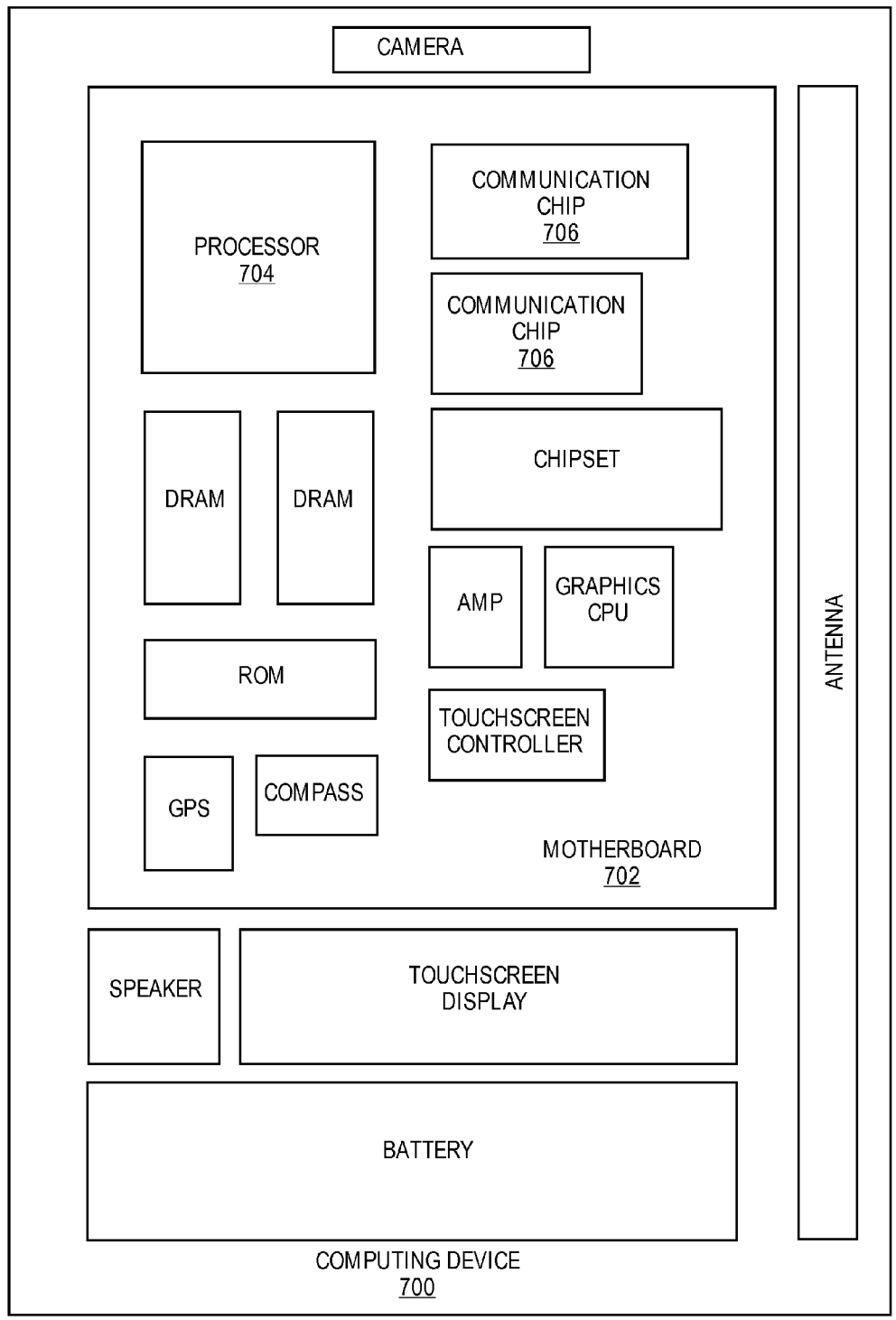
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments of the present invention include semiconductor devices having germanium active layers with underlying parasitic leakage barrier layers.

In an embodiment, a planar semiconductor device includes a first buffer layer disposed above a substrate. A parasitic leakage barrier is disposed above the first buffer layer. A second buffer layer is disposed above the parasitic leakage barrier. A germanium active layer is disposed above the second buffer layer. A gate electrode stack is disposed above the germanium active layer. Source and drain regions are disposed above the parasitic leakage barrier, on either side of the gate electrode stack.

In one embodiment, the parasitic leakage barrier includes a semiconductor layer having a band-gap greater than a band-gap of the first buffer layer, greater than a band-gap of the second buffer layer, and greater than a band-gap of the germanium active layer.

In one embodiment, the parasitic leakage barrier does not disrupt an effective lattice constant of the first buffer layer.

In one embodiment, the first buffer layer is disposed on the substrate, the parasitic leakage barrier is disposed on the first buffer layer, the second buffer layer is disposed on the parasitic leakage barrier, the germanium active layer is disposed on the second buffer layer, and the gate electrode stack is disposed on the germanium active layer.

In one embodiment, the substrate is composed essentially of silicon, the first buffer layer is composed of silicon germanium, the second buffer layer is composed of silicon germanium having a higher concentration of germanium than the first buffer layer, and the germanium active layer is composed essentially of germanium.

In one embodiment, the parasitic leakage barrier includes a layer composed essentially of silicon or of silicon germanium having a lower concentration of germanium than the first or second buffer layers.

In one embodiment, the parasitic leakage barrier includes alternating first and second layer types. The first layer types are composed essentially of silicon or of silicon germanium having a lower concentration of germanium than the first or second buffer layers. The second layer types is composed essentially the same material as the first buffer layer.

In one embodiment, the first buffer layer is composed of approximately $Si_{0.7}Ge_{0.3}$, the second buffer layer is composed of approximately $Si_{0.3}Ge_{0.7}$, and the first layer types is composed essentially of silicon and has a thickness approximately in the range of 1-3 nanometers.

In one embodiment, the parasitic leakage barrier includes alternating first and second layer types. The first layer types are composed essentially of silicon or of silicon germanium having a lower concentration of germanium than the first or second buffer layers. The second layer types is composed essentially the same material as the second buffer layer.

In one embodiment, the source and drain regions are disposed in the germanium active layer and in the second buffer layer, but are not in contact with the parasitic leakage barrier.

In an embodiment, a non-planar semiconductor device includes a first buffer layer disposed above a substrate. A parasitic leakage barrier is disposed above the first buffer layer. A second buffer layer is disposed above the parasitic leakage barrier. A three-dimensional germanium active layer is disposed above the second buffer layer. A gate electrode stack is disposed on and at least partially surrounds the three-dimensional germanium active layer. Source and drain regions are disposed above the parasitic leakage barrier, on either side of the gate electrode stack.

In one embodiment, the gate electrode stack completely surrounds the three-dimensional germanium active layer, and the non-planar semiconductor device further includes a bottom gate insulating (BGI) structure disposed between the parasitic leakage barrier and a bottom portion of the gate electrode stack.

In one embodiment, the parasitic leakage barrier includes a semiconductor layer having a band-gap greater than a band-gap of the first buffer layer, greater than a band-gap of the second buffer layer, and greater than a band-gap of the three-dimensional germanium active layer.

In one embodiment, the parasitic leakage barrier does not disrupt an effective lattice constant of the first buffer layer.

In one embodiment, the first buffer layer is disposed on the substrate, the parasitic leakage barrier is disposed on the first buffer layer, the second buffer layer is disposed on the parasitic leakage barrier, and at least a portion of the three-dimensional germanium active layer is disposed on the second buffer layer.

In one embodiment, the substrate is composed essentially of silicon, the first buffer layer is composed of silicon germanium, the second buffer layer is composed of silicon germanium having a higher concentration of germanium than the first buffer layer, and the three-dimensional germanium active layer is composed essentially of germanium.

In one embodiment, the parasitic leakage barrier includes a layer composed essentially of silicon or of silicon germanium having a lower concentration of germanium than the first or second buffer layers.

In one embodiment, the parasitic leakage barrier includes alternating first and second layer types, the first layer types is composed essentially of silicon or of silicon germanium having a lower concentration of germanium than the first or second buffer layers, and the second layer types is composed essentially the same material as the first buffer layer.

In one embodiment, the first buffer layer is composed of approximately $Si_{0.7}Ge_{0.3}$, the second buffer layer is composed of approximately $Si_{0.3}Ge_{0.7}$, and the first layer types is composed essentially of silicon and has a thickness approximately in the range of 1-3 nanometers.

In one embodiment, the parasitic leakage barrier includes alternating first and second layer types, the first layer types is composed essentially of silicon or of silicon germanium has a lower concentration of germanium than the first or second buffer layers, and the second layer types is composed essentially of the same material as the second buffer layer.

In an embodiment, a semiconductor device includes a vertical arrangement of one or more germanium nanowires disposed above a substrate. A first buffer layer is disposed above the substrate. A parasitic leakage barrier is disposed above the first buffer layer. A second buffer layer is disposed above the parasitic leakage barrier. The bottom-most germanium nanowire is disposed above the second buffer layer. A gate electrode stack is disposed on and at least partially surrounds the bottom-most germanium nanowire, and is disposed on and completely surrounds the remaining germanium nanowires. Source and drain regions are disposed in each germanium nanowire, on either side of the gate electrode stack.

In one embodiment, the gate electrode stack completely surrounds the bottom-most germanium nanowire, and the semiconductor device further includes a bottom gate insulating (BGI) structure disposed between the parasitic leakage barrier and a bottom portion of the gate electrode stack.

In one embodiment, the parasitic leakage barrier includes a semiconductor layer having a band-gap greater than a band-gap of the first buffer layer, greater than a band-gap of the second buffer layer, and greater than a band-gap of the germanium nanowires.

In one embodiment, the parasitic leakage barrier does not disrupt an effective lattice constant of the first buffer layer.

In one embodiment, the first buffer layer is disposed on the substrate, the parasitic leakage barrier is disposed on the first buffer layer, and the second buffer layer is disposed on the parasitic leakage barrier.

In one embodiment, the substrate is composed essentially of silicon, the first buffer layer is composed of silicon germanium, the second buffer layer is composed of silicon germanium having a higher concentration of germanium than the first buffer layer, and the germanium nanowires are composed essentially of germanium.

In one embodiment, the parasitic leakage barrier includes a layer composed essentially of silicon or of silicon germanium having a lower concentration of germanium than the first or second buffer layers.

In one embodiment, the parasitic leakage barrier includes alternating first and second layer types. The first layer types are composed essentially of silicon or of silicon germanium having a lower concentration of germanium than the first or second buffer layers. The second layer types is composed essentially the same material as the first buffer layer.

In one embodiment, the first buffer layer is composed of approximately $Si_{0.7}Ge_{0.3}$, the second buffer layer is composed of approximately $Si_{0.3}Ge_{0.7}$, and the first layer types is composed essentially of silicon and has a thickness approximately in the range of 1-3 nanometers.

In one embodiment, the parasitic leakage barrier includes alternating first and second layer types. The first layer types are composed essentially of silicon or of silicon germanium having a lower concentration of germanium than the first or second buffer layers. The second layer types are composed of essentially the same material as the second buffer layer.

What is claimed is:

1. A planar semiconductor device, comprising:
a first buffer layer disposed above a substrate;
a parasitic leakage barrier disposed above the first buffer layer;
a second buffer layer disposed above the parasitic leakage barrier;
a germanium active layer disposed above the second buffer layer;
a gate electrode stack disposed above the germanium active layer; and
source and drain regions disposed above the parasitic leakage barrier, on either side of the gate electrode stack, wherein the source and drain regions are disposed in the germanium active layer and in the second buffer layer, but are not in contact with the parasitic leakage barrier.

2. The planar semiconductor device of claim 1, wherein the parasitic leakage barrier comprises a semiconductor layer having a band-gap greater than a band-gap of the first buffer layer, greater than a band-gap of the second buffer layer, and greater than a band-gap of the germanium active layer.

3. The planar semiconductor device of claim 1, wherein the parasitic leakage barrier does not disrupt an effective lattice constant of the first buffer layer.

4. The planar semiconductor device of claim 1, wherein the first buffer layer is disposed on the substrate, the parasitic leakage barrier is disposed on the first buffer layer, the second buffer layer is disposed on the parasitic leakage barrier, the germanium active layer is disposed on the second buffer layer, and the gate electrode stack is disposed on the germanium active layer.

5. The planar semiconductor device of claim 4, wherein the substrate consists essentially of silicon, the first buffer layer comprises silicon germanium, the second buffer layer comprises silicon germanium having a higher concentration of germanium than the first buffer layer, and the germanium active layer consists essentially of germanium.

6. The planar semiconductor device of claim 5, wherein the parasitic leakage barrier comprises a layer consisting essentially of silicon or of silicon germanium having a lower concentration of germanium than the first or second buffer layers.

7. The planar semiconductor device of claim 5, wherein the parasitic leakage barrier comprises alternating first and second layer types, the first layer types consisting essentially of silicon or of silicon germanium having a lower concentration of germanium than the first or second buffer layers, and the second layer types comprising essentially the same material as the first buffer layer.

8. The planar semiconductor device of claim 7, wherein the first buffer layer comprises approximately $Si_{0.7}Ge_{0.3}$, the second buffer layer comprises approximately $Si_{0.3}Ge_{0.7}$, and the first layer types consists essentially of silicon and has a thickness approximately in the range of 1-3 nanometers.

9. The planar semiconductor device of claim 5, wherein the parasitic leakage barrier comprises alternating first and second layer types, the first layer types consisting essentially of silicon or of silicon germanium having a lower concentration of germanium than the first or second buffer layers, and the second layer types comprising essentially the same material as the second buffer layer.

10. A non-planar semiconductor device, comprising:
a first buffer layer disposed above a substrate;
a parasitic leakage barrier disposed above the first buffer layer;
a second buffer layer disposed above the parasitic leakage barrier;
a three-dimensional germanium active layer disposed above the second buffer layer;
gate electrode stack disposed on and completely surrounding the three-dimensional germanium active layer;
a bottom gate insulating (BGI) structure disposed between the parasitic leakage barrier and a bottom portion of the gate electrode stack; and
source and drain regions disposed above the parasitic leakage barrier, on either side of the gate electrode stack.

11. The non-planar semiconductor device of claim 10, wherein the parasitic leakage barrier comprises a semiconductor layer having a band-gap greater than a band-gap of the first buffer layer, greater than a band-gap of the second buffer layer, and greater than a band-gap of the three-dimensional germanium active layer.

12. The non-planar semiconductor device of claim 10, wherein the parasitic leakage barrier does not disrupt an effective lattice constant of the first buffer layer.

13. The non-planar semiconductor device of claim 10, wherein the first buffer layer is disposed on the substrate, the parasitic leakage barrier is disposed on the first buffer layer, the second buffer layer is disposed on the parasitic leakage barrier, and at least a portion of the three-dimensional germanium active layer is disposed on the second buffer layer.

14. The non-planar semiconductor device of claim 13, wherein the substrate consists essentially of silicon, the first buffer layer comprises silicon germanium, the second buffer layer comprises silicon germanium having a higher concentration of germanium than the first buffer layer, and the three-dimensional germanium active layer consists essentially of germanium.

15. The non-planar semiconductor device of claim 14, wherein the parasitic leakage barrier comprises a layer consisting essentially of silicon or of silicon germanium having a lower concentration of germanium than the first or second buffer layers.

16. The non-planar semiconductor device of claim 14, wherein the parasitic leakage barrier comprises alternating first and second layer types, the first layer types consisting essentially of silicon or of silicon germanium having a lower concentration of germanium than the first or second buffer layers, and the second layer types comprising essentially the same material as the first buffer layer.

17. The non-planar semiconductor device of claim 16, wherein the first buffer layer comprises approximately $Si_{0.7}Ge_{0.3}$, the second buffer layer comprises approximately $Si_{0.3}Ge_{0.7}$, and the first layer types consists essentially of silicon and has a thickness approximately in the range of 1-3 nanometers.

18. The non-planar semiconductor device of claim 14, wherein the parasitic leakage barrier comprises alternating first and second layer types, the first layer types consisting essentially of silicon or of silicon germanium having a lower concentration of germanium than the first or second buffer layers, and the second layer types comprising essentially the same material as the second buffer layer.

19. A semiconductor device, comprising:
a vertical arrangement of one or more germanium nanowires disposed above a substrate;
a first buffer layer disposed above the substrate;
a parasitic leakage barrier disposed above the first buffer layer;
wherein a bottom-most germanium nanowire is disposed above the parasitic leakage layer;
a gate electrode stack disposed on and at least partially surrounding the bottom-most germanium nanowire of the one or more germanium nanowires, and disposed on and completely surrounding remaining of the one or more germanium nanowires; and
source and drain regions disposed in each germanium nanowire, on either side of the gate electrode stack.

20. The semiconductor device of claim 19, wherein the gate electrode stack completely surrounds the bottom-most germanium nanowire, the semiconductor device further comprising:
a bottom gate insulating (BGI) structure disposed between the parasitic leakage barrier and a bottom portion of the gate electrode stack.

21. The semiconductor device of claim 19, wherein the parasitic leakage barrier comprises a semiconductor layer having a band-gap greater than a band-gap of the first buffer layer and greater than a band-gap of the germanium nanowires.

22. The semiconductor device of claim 19, wherein the parasitic leakage barrier does not disrupt an effective lattice constant of the first buffer layer.

23. The semiconductor device of claim 19, wherein the first buffer layer is disposed on the substrate, and the parasitic leakage barrier is disposed on the first buffer layer.

24. The semiconductor device of claim 23, wherein the substrate consists essentially of silicon, the first buffer layer comprises silicon germanium, and the germanium nanowires consist essentially of germanium.

25. The semiconductor device of claim 24, wherein the parasitic leakage barrier comprises a layer consisting essentially of silicon or of silicon germanium having a lower concentration of germanium than the first layer.

26. The semiconductor device of claim 24, wherein the parasitic leakage barrier comprises alternating first and second layer types, the first layer types consisting essentially of silicon or of silicon germanium having a lower concentration of germanium than the first buffer layer, and the second layer types comprising essentially the same material as the first buffer layer.

27. The semiconductor device of claim 26, wherein the first buffer layer comprises approximately $Si_{0.7}Ge_{0.3}$, and the first layer types consist essentially of silicon and have a thickness approximately in the range of 1-3 nanometers.

28. The semiconductor device of claim 24, wherein the parasitic leakage barrier comprises alternating first and second layer types, the first layer types consisting essentially of silicon or of silicon germanium having a lower concentration of germanium than the first buffer layer.

29. A planar semiconductor device, comprising:
a first buffer layer disposed on a substrate, wherein the substrate consists essentially of silicon and the first buffer layer comprises silicon germanium;
a parasitic leakage barrier disposed on the first buffer layer;
a second buffer layer disposed on the parasitic leakage barrier, the second buffer layer comprising silicon germanium having a higher concentration of germanium than the first buffer layer, wherein the parasitic leakage barrier comprises alternating first and second layer types, the first layer types consisting essentially of silicon or of silicon germanium having a lower concentration of germanium than the first or second buffer layers, and the second layer types comprising essentially the same material as the first buffer layer;
a germanium active layer disposed on the second buffer layer, wherein the germanium active layer consists essentially of germanium;
a gate electrode stack disposed on the germanium active layer; and
source and drain regions disposed above the parasitic leakage barrier, on either side of the gate electrode stack.

30. The planar semiconductor device of claim 29, wherein the first buffer layer comprises approximately $Si_{0.7}Ge_{0.3}$, the second buffer layer comprises approximately $Si_{0.3}Ge_{0.7}$, and the first layer types consists essentially of silicon and has a thickness approximately in the range of 1-3 nanometers.

31. A planar semiconductor device, comprising:
a first buffer layer disposed on a substrate, wherein the substrate consists essentially of silicon and the first buffer layer comprises silicon germanium;
a parasitic leakage barrier disposed on the first buffer layer;
a second buffer layer disposed on the parasitic leakage barrier, the second buffer layer comprising silicon germanium having a higher concentration of germanium than the first buffer layer, wherein the parasitic leakage barrier comprises alternating first and second layer types, the first layer types consisting essentially of silicon or of silicon germanium having a lower concentration of germanium than the first or second buffer layers, and the second layer types comprising essentially the same material as the second buffer layer;
a germanium active layer disposed on the second buffer layer, wherein the germanium active layer consists essentially of germanium;
a gate electrode stack disposed on the germanium active layer; and
source and drain regions disposed above the parasitic leakage barrier, on either side of the gate electrode stack.

32. A non-planar semiconductor device, comprising:
a first buffer layer disposed on a substrate, wherein the substrate consists essentially of silicon and the first buffer layer comprises silicon germanium;
a parasitic leakage barrier disposed on the first buffer layer;
a second buffer layer disposed on the parasitic leakage barrier, wherein the second buffer layer comprises silicon germanium having a higher concentration of germanium than the first buffer layer, and wherein the parasitic leakage barrier comprises alternating first and second layer types, the first layer types consisting essentially of silicon or of silicon germanium having a lower concentration of germanium than the first or second buffer layers, and the second layer types comprising essentially the same material as the first buffer layer;

a three-dimensional germanium active layer disposed above the second buffer layer, wherein at least a portion of the three-dimensional germanium active layer is disposed on the second buffer layer, and wherein the three-dimensional germanium active layer consists essentially of germanium;

a gate electrode stack disposed on and at least partially surrounding the three-dimensional germanium active layer; and source and drain regions disposed above the parasitic leakage barrier, on either side of the gate electrode stack.

33. The non-planar semiconductor device of claim 32, wherein the first buffer layer comprises approximately $Si_{0.7}Ge_{0.3}$, the second buffer layer comprises approximately $Si_{0.3}Ge_{0.7}$, and the first layer types consists essentially of silicon and has a thickness approximately in the range of 1-3 nanometers.

34. A non-planar semiconductor device, comprising:

a first buffer layer disposed on a substrate, wherein the substrate consists essentially of silicon and the first buffer layer comprises silicon germanium;

a parasitic leakage barrier disposed on the first buffer layer;

a second buffer layer disposed on the parasitic leakage barrier, wherein the second buffer layer comprises silicon germanium having a higher concentration of germanium than the first buffer layer, and wherein the parasitic leakage barrier comprises alternating first and second layer types, the first layer types consisting essentially of silicon or of silicon germanium having a lower concentration of germanium than the first or second buffer layers, and the second layer types comprising essentially the same material as the second buffer layer;

a three-dimensional germanium active layer disposed above the second buffer layer, wherein at least a portion of the three-dimensional germanium active layer is disposed on the second buffer layer, and wherein the three-dimensional germanium active layer consists essentially of germanium;

a gate electrode stack disposed on and at least partially surrounding the three-dimensional germanium active layer; and source and drain regions disposed above the parasitic leakage barrier, on either side of the gate electrode stack.

\* \* \* \* \*